United States Patent [19]
Bohnert et al.

[11] Patent Number: 5,196,695
[45] Date of Patent: Mar. 23, 1993

[54] FIBER-OPTIC SENSOR HAVING NEAR-FIELD AND REMOTE-FIELD SIGNALS

[75] Inventors: Klaus Bohnert, Niederrohrdorf; Mathias Fauth, Baar, both of Switzerland

[73] Assignee: Asea Brown Boveri Ltd., Baden, Switzerland

[21] Appl. No.: 877,071

[22] Filed: May 1, 1992

[30] Foreign Application Priority Data

May 2, 1991 [DE] Fed. Rep. of Germany ....... 4114253

[51] Int. Cl.[5] ................................................ H01J 5/16
[52] U.S. Cl. .................................. 250/227.17; 324/96
[58] Field of Search ...................... 250/227.17, 227.16, 250/227.11, 227.19, 227.27, 225; 324/96; 385/1; 356/349

[56] References Cited

U.S. PATENT DOCUMENTS

| | | |
|---|---|---|
| 3,781,092 | 12/1973 | Sussman et al. ........................ 324/96 |
| 4,319,186 | 3/1982 | Kingsley . |
| 4,468,091 | 8/1984 | Schmadel et al. . |
| 4,477,723 | 10/1984 | Carome et al. . |
| 4,547,729 | 10/1985 | Adolfsson et al. . |
| 4,922,095 | 5/1990 | Gergehy .......................... 250/227.17 |
| 4,929,830 | 5/1990 | Bohnert et al. . |

FOREIGN PATENT DOCUMENTS

| | | |
|---|---|---|
| 0010221 | 2/1983 | European Pat. Off. . |
| 0316619 | 10/1988 | European Pat. Off. . |
| 0316635 | 5/1989 | European Pat. Off. . |
| 0393382 | 10/1990 | European Pat. Off. . |
| 90123660.4 | 12/1990 | European Pat. Off. . |
| 2130046 | 9/1974 | Fed. Rep. of Germany . |
| 2845625 | 4/1980 | Fed. Rep. of Germany . |
| 2945019 | 5/1980 | Fed. Rep. of Germany . |
| 2856183 | 7/1980 | Fed. Rep. of Germany . |
| 3019030 | 12/1980 | Fed. Rep. of Germany . |
| 3229570 | 2/1984 | Fed. Rep. of Germany . |
| 3232445 | 3/1984 | Fed. Rep. of Germany . |
| 3504945 | 11/1985 | Fed. Rep. of Germany . |
| 4025911 | 4/1991 | Fed. Rep. of Germany . |

OTHER PUBLICATIONS

"Fiber-Optic Sensing of Electric Field Components", Bohnert, et al., APPLIED OPTICS, vol. 27, No. 23, 1 Dec. 1988, pp. 4814 to 4818.
"Fiber-Optic Snesing of Voltages by Line Integration of the Electric Field", Bohnert, et al., OPTICS LETTERS, Optical Society of America, reprint, pp. 290-292, Dec. 1988.
"Use of Highly Elliptical Core Fibers for Two-Mode Fiber Devices", Kim. et al., OPTICS LETTERS, Sep. 1987, vol. 12, No. 9, pp. 729-731.
"Elimination of Drift in a Single-Mode Optical Fiber Interferometer Using a Piezoelectrically Stretched Coiled Fiber", Jackson, et al., APPLIED OPTICS, vol. 19, No. 17, Sep. 1980, pp. 2926-2929.
"Homodyne Demodulation Scheme for Fiber Optic Sensors Using Phase Generated Carrier", Dandridge, et al., IEEE Journal of Quantum Electronics, vol. QE-18, No. 10, Oct. 1982, pp. 1647-1653.
"Synthetic-Heterodyne Interferometric Demodulation", Cole, et al., IEEE Journal of Quantum Electronics, vol. QE-18, No. 4, Apr. 1982, pp. 694-697.
"Optical Techniques to Solve the Signal Fading Problem in Fiber Interferometers", Sheem, et al., APPLIED OPTICS, vol. 21, No. 4, Feb. 1982, pp. 689-693.
"Passive Quadrature Phase Detector for Coherent Fiber Optic Systems", Huang, et al., Springer Proceedings in Physics, vol. 44, 1989, pp. 38-43.

*Primary Examiner*—David C. Nelms
*Assistant Examiner*—Que T. Le
*Attorney, Agent, or Firm*—Burns, Doane, Swecker & Mathis

[57] ABSTRACT

In a fiber-optic sensor for alternating electric fields or voltages, the interference in a bimodal fiber (3) is measured passively. To this end, the mutually phase-shifted near-field and remote-field signals are separated by optical means (15) at the exit end of the bimodal fiber (3), and passed to appropriate detectors (17a, b, c), and the electrical signals created are evaluated by electronic means (18).

12 Claims, 6 Drawing Sheets

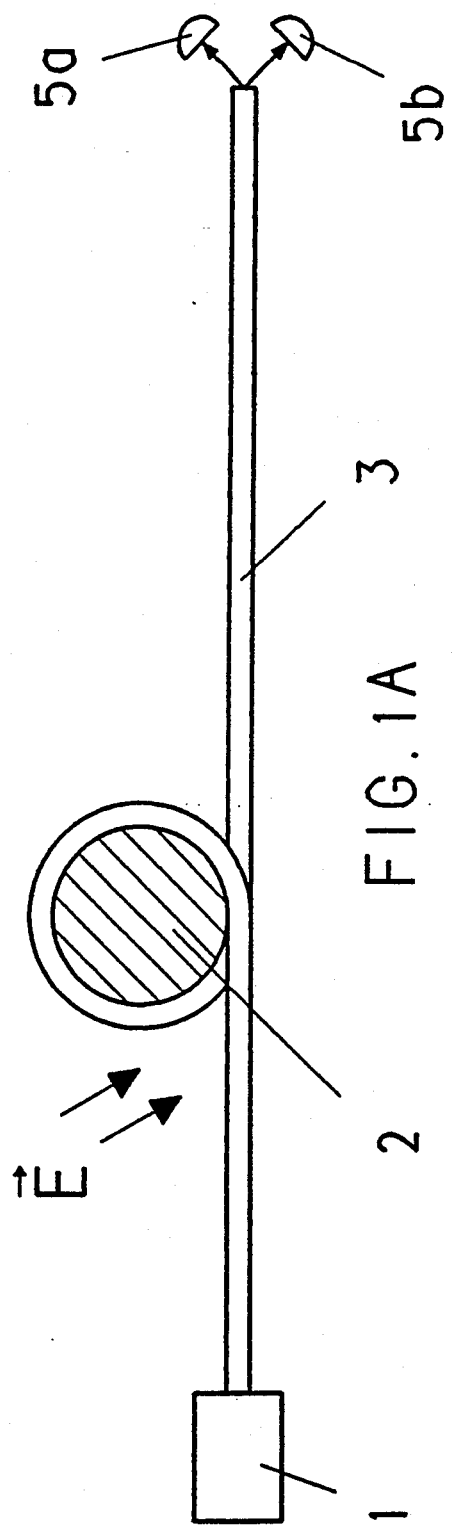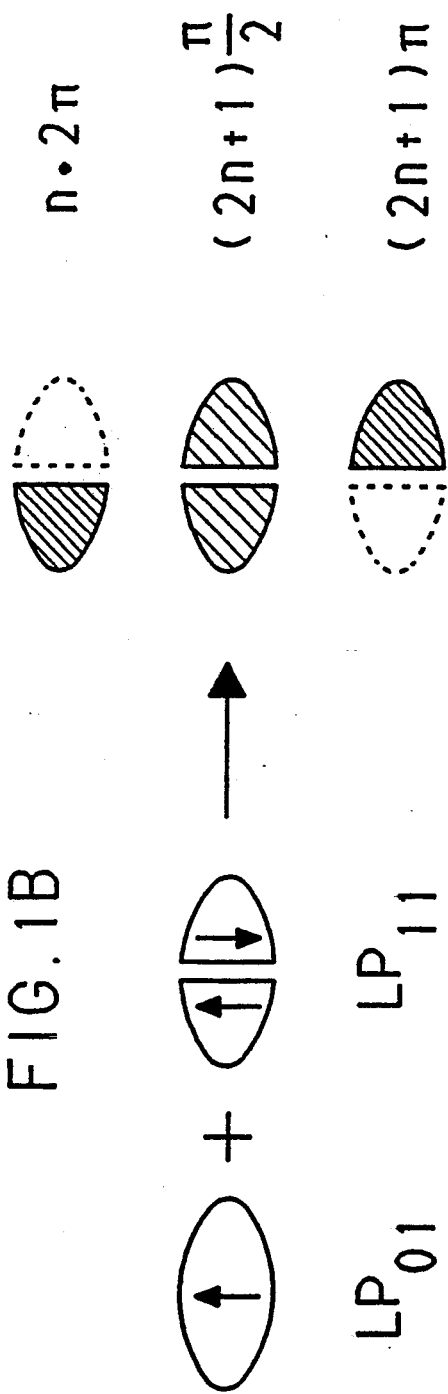

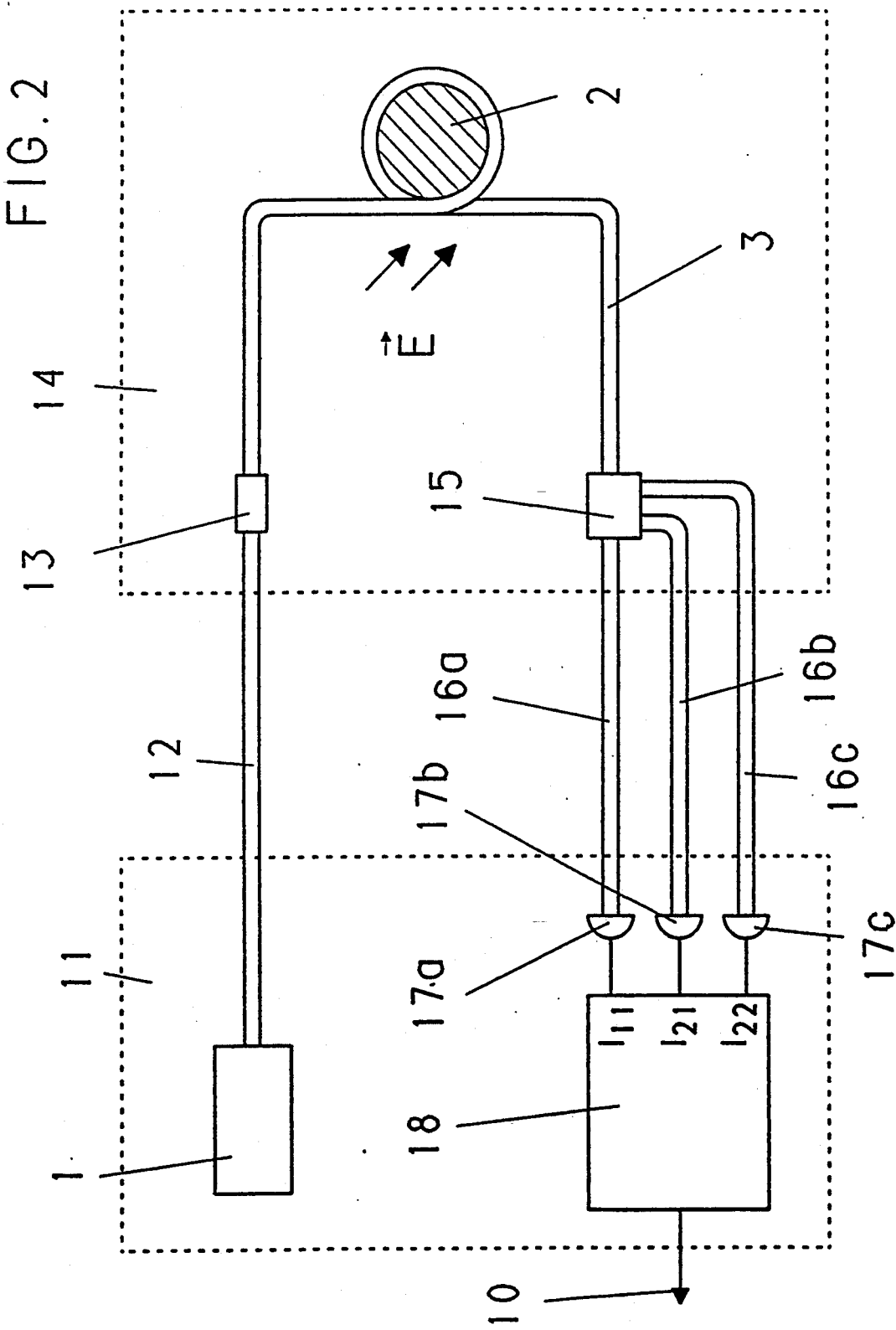

FIBER-OPTIC SENSOR HAVING NEAR-FIELD AND REMOTE-FIELD SIGNALS

BACKGROUND OF THE INVENTION

1. Field of the Invention

The invention relates to the field of fiber optics. It concerns, especially, a fiber-optic sensor for alternating electric fields or voltages, comprising (a) a piezoelectric sensor element;

(b) an optical fiber having an entrance end and an exit end, which optical fiber is fixed at least partially to the sensor element so that a dimensional change of the sensor element in an electric field leads to a change in the length of the fiber; and (c) means for measuring the field-dependent change in length of the fiber;

Such a fiber-optic sensor is known, for example, from EP-Al-0,316,619.

2. Discussion of Background

Various publications such as, for example, European Patent Applications EP-Al-0,316,619 and EP-Al-0,316,635 or the articles by K. Bohnert and J. Nehring in Appl. Opt. 27, pp. 4814-4818 (1988), or Opt. Lett. 14, pp. 290-292 (1989), have already contained descriptions of fiber-optic sensors for measuring electric fields and voltages.

The measurement principle employed in this case is based on the inverse piezoelectric effect in materials with selected crystal symmetry. The temporally periodic dimensional change which is experienced by an appropriate piezoelectric body in an alternating electric field is transferred to a glass fiber fixed to the body. The change in the length of the fiber is then proportional to the amplitude of the field or voltage and is interferometrically measured and evaluated.

It is possible to use various types of glass fiber interferometers for the interferometric measurement. As a result of its simplicity, of these types the bimodal fiber interferometer disclosed in the article by B. Y. Kim et al., Opt. Lett. 12, pp. 729-731 (1987) is of particular interest. In the case of this interferometer, the parameters of the sensor fiber are selected so that precisely two modes (the $LP_{01}$ fundamental mode and the even $LP_{11}$ mode) can propagate in the fiber.

As shown in FIG. 1A with reference to the principle of a fiber-optic 1 field sensor, in the case of the bimodal fiber interferometer light is passed from a coherent light source 1, e.g. a laser diode, through a bimodal fiber 3, which is fixed to a piezoelectric sensor element 2 for the electric field E. At the fiber end it is then possible to observe an interference pattern which arises from the superposition of these two modes. A change in the length of the fiber leads to a differential phase shift between the two modes, which is expressed in a corresponding change in the interference pattern. FIG. 1B shows such interference patterns for three characteristic phase differences $n2pi$, $(2n+1)(pi/2)$ and $(2n+1)pi$.

The two mutually adjacent substructures of the interference pattern (indicated in FIG. 1B by semiellipses) are detected by two detectors $5a$ and $5b$ (e.g. in the form of photodiodes). Two signals $V_{11}$ and $V_{12}$ which are phase-shifted by 180° are present at the output thereof:

$$V_{11} = (\tfrac{1}{2})V_0(1 + a\cos\Phi(t)) \quad (1)$$

$$V_{12} = (\tfrac{1}{2})V_0(1 - a\cos\Phi(t)) \quad (2)$$

where $\Phi(t) = A\sin\Omega t + \Theta(t)$. The phase shift $\Phi(t)$ between the two modes is thus composed of a temporally periodic component $A\sin\Omega t$ which is generated by the alternating field to be measured (in this case, A is proportional to the amplitude of the field) and an arbitrary phase term $\Theta(t)$, which may likewise alter with time, for example, in consequence of temperature-dependent fluctuations of the fiber length. Finally, $V_0$ is proportional to the optical power and a is a measure of the interference contrast.

The target term $A\sin\Omega t$ is frequently obtained by a homodyne detection process (FIG. 1C) from the output signals of the detectors $5a$ and $5b$ (for a fiber-optical sensor with a monomode fiber, see in this connection: D. A. Jackson et al., Appl. Opt. 19, pp. 2926-2929 (1980); a corresponding fiber-optic sensor with a bimodal fiber is described in the older European Application No. 90123660.4). In this process, the sensor fiber (in the example shown in FIG. 1C, the bimodal fiber 3) is additionally passed via a piezoelectric modulator 4. By means of this modulator 4, the phase difference $\Phi(t)$ is set to $+(pi/2)$ or $-(pi/2)$ (modulo 2pi). To this end, the modulator 4 is a component of a control loop, which consists of the detectors $5a$ and $5b$, a subtractor 7, a quadrature controller 8 and a feedback line 6 and which sets the difference voltage $$V = V_{11} - V_{12} = V_0 a\cos\Phi(t) \quad (3)$$

correspondingly to zero.

The two components $A\sin\Omega t$ and $\Theta(t)$ of the phase shift are thus precisely balanced by the modulator via a corresponding (offset) change in length of the fiber. The voltage present at the modulator 4 then contains a slowly varying component, which is proportional to $\Theta(t)$ and a periodic component which is proportional to $A\sin\Omega t$. The target component $A\sin\Omega t$ is filtered out by means of a high pass filter 9 and can be picked off at the signal output 10. As a result of this, the output signal is independent of any possible fluctuations of the laser intensity (i.e. $V_0$) and of the interference contrast a.

In addition to the homodyne process, the literature describes certain further detection processes, which have the advantage that an additional modulator in the region of the interferometer can be dispensed with, but which processes require instead a more complicated sensor electronic system for the signal demodulation, which moreover frequently exhibits a low degree of precision. Examples of this are the synthetic heterodyne process (J. H. Cole et al., IEEE J. Quant. Electr. QE-18, pp. 694-697 (1982)), the homodyne process with a phase-modulated carrier signal (A. Dandridge et al., IEEE J. Quant. Electr. QE-18, pp. 1647-1653 (1982)), and processes in which two interferometer signals are generated by optical means, which signals are phase-shifted by 90° relative to one another (S. K. Sheem et al., Appl. Opt. 21, pp. 689-693 (1982)).

In a series of practical applications of the sensor (e.g. in voltage measurement in outdoor substations) it is possible for relatively large spacings to occur between the actual sensor head and the sensor electronic system (10 m to a few 100 $\mu$). It is inexpedient to bridge these spacings by the bimodal fiber itself, since the influence of external disturbing factors (temperature fluctuations, mechanical vibrations etc.) increases with increasing fiber length in a corresponding manner and the signal/noise ratio deteriorates. The light feed from the laser diode to the interferometer and the return of the output signals of the interferometer should rather take place via separate glass fibers which are not a component of the interferometer.

In the above described homodyne process, having an active phase modulator, it would however in addition to the connecting glass fibers also be necessary to provide an electrical connection (the feedback line 6) between the sensor electronic system and the sensor head to drive the modulator 4. The attractiveness of a sensor operating with this type of interferometer would thus be very limited.

SUMMARY OF THE INVENTION

The object of the present invention is thus to provide a fiber-optic sensor which is distinguished by a simple construction and a high degree of accuracy and immunity to disturbance, and in which the actual measurement fiber can be coupled exclusively via separate glass fibers to the light source and the evaluating electronic system.

In the case of a fiber-optic sensor of the initially mentioned type, the object is achieved in that
 (d) the fiber is a bimodal fiber, the parameters of which are selected so that the $LP_{01}$ fundamental mode and the even $LP_{11}$ mode can propagate within it;
 (e) upstream of the entrance end of the bimodal fiber there is disposed a coherent light source which excites the two modes of the bimodal fiber; and
 (f) the means for measuring the field-dependent change in length of the fiber comprise optical means for the separation of the near-field and remote-field signals present at the exit end of the bimodal fiber, detectors for the conversion of the near-field and remote-field signals into corresponding electrical signals and electronic means for obtaining the length change information from these converted near-field and remote-field signals.

The core of the invention consists in providing, in place of the known active signal detection, which requires an additional modulator in the measurement fiber with a corresponding electrical supply line, a passive signal detection which is based on the Guoy effect (in this connection, see: S. Y. Huang et al., Springer Proc. in Physics, Vol. 44 "Optical Fiber Sensors", pp. 38–43, Springer Verlag Berlin, Heidelberg (1989)), i.e. the phase difference between the interference patterns of the near field and remote field: the substructures of the near field and remote field (in total 4) are separated by optical means and can be transferred via separate glass fibers to a remote evaluating electronic system. There, using at least three of these four substructures the desired information on the change in length of the measurement fiber can be obtained.

According to a first preferred embodiment of the sensor according to the invention, the optical means for the separation of the near-field and remote-field signals comprise:
 (a) a first lens, disposed directly at the exit end of the bimodal fiber, for the collimation of the two modes emerging from the bimodal fiber to form a parallel beam;
 (b) a first beam splitter which is disposed downstream of the first lens and which splits up the parallel beam into two partial beams;
 (c) a second lens with a downstream first coupling-out fiber, which second lens focuses the first of the two partial beams so that the end surface of the bimodal fiber is imaged onto the entrance end of the first coupling-out fiber; and
 (d) a third lens with at least one downstream second coupling-out fiber, which third lens concentrates the second partial beam so that the entrance end of the second coupling-out fiber is still situated within the optical remote field of the bimodal fiber, but the light is already efficiently coupled into the second coupling-out fiber.

A further preferred embodiment of the sensor according to the invention is distinguished in that
 (a) the bimodal fiber together with the sensor element and the optical means for the separation of the near-field and remote-field signals emerging at the exit end of the bimodal fiber forms a separate sensor head;
 (b) the light source, the detectors and the electronic means for obtaining the length change information from these near-field and remote-field signals are part of a separate sensor electronic system;
 (c) the light source is optically connected via a polarization-retaining monomode fiber with the entrance end of the bimodal fiber; and
 (d) the detectors are optically connected with the optical means by separate glass fibers in the form of multimode fibers.

Further embodiments are evident from the subclaims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A shows an example of a fiber-optic E field sensor with a bimodal fiber;

FIG. 1B shows the basic representation of the interference patterns at the exit end of the bimodal fiber (3) of FIG. 1A;

FIG. 2 shows a preferred embodiment of a fiber-optic sensor according to the invention;

DESCRIPTION OF THE PREFERRED EMBODIMENTS

Figure 1C:
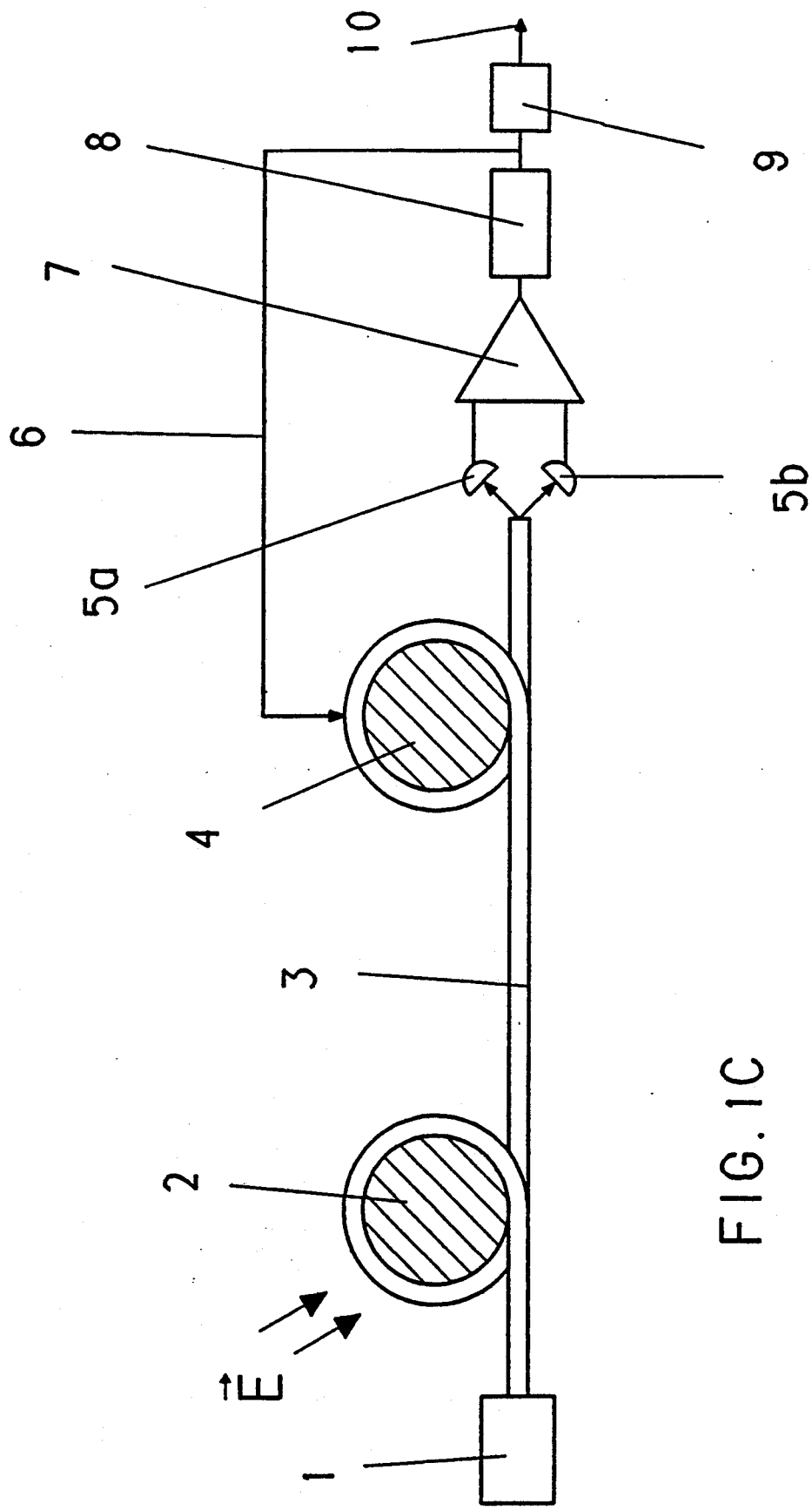
FIG. 1C shows an E field sensor, modified as compared with FIG. 1A, with active signal detection.

Referring now to the drawings, wherein like reference numerals designate identical or corresponding parts throughout the several views, FIG. 1A shows the already initially described basic form of a fiber-optic sensor with a bimodal fiber interferometer, as said form forms the starting point for the invention. The central part of the sensor is a bimodal fiber 3 which is fixedly connected over a partial section with a piezoelectric sensor element 2. At the entrance end of the bimodal fiber 3 there is disposed a coherent light source 1 which excites the two modes $LP_{01}$ and $LP_{11}$ in the fiber. The two modes suffer, on passing through the fiber, a phase difference and correspondingly interfere, so that at the exit end of the bimodal fiber 3 an interference pattern with two substructures is formed which changes as a function of the length of the fiber and is reproduced in FIG. 1B for 3 selected phase differences.

The intensities of the two substructures can in the simplest case be converted by means of two detectors 5a, b (photodiodes) into corresponding electrical signals and can be evaluated in an evaluation electronic system which is not shown in greater detail; in this case, however, changes in the operating point cannot be compensated.

Such compensations are—as likewise mentioned initially—possible with the sensor construction according to FIG. 1C, which is affected by disadvantages and in which the bimodal fiber 3 is additionally fixed to a piezoelectric modulator 4, which permits the application of the homodyne process with active signal detection.

In this case, the invention now follows a different path: between the interference patterns in the optical near field (directly at the exit end of the bimodal fiber) and the interference patterns in the optical remote field (at a distance $>100$ μm from the exit end) there is, on account of the abovementioned Guoy effect, a phase difference of pi/2. By means of an optical arrangement which permits the separation of the optical near-field and remote-field signals and guidance of those signals via separate glass fibers to remote detectors, and by means of an electronic arrangement for the demodulation of the detector signals, in order to obtain therefrom an output signal proportional to the measurement parameter, a passive signal detection is now constructed, which avoids the disadvantages of the homodyne process.

A preferred embodiment of such a fiber-optic sensor according to the invention is reproduced in FIG. 2. The sensor element 2 and the bimodal fiber 3 form, together with optical means 15 for the separation of the near-field and remote-field signals emerging at the exit end of the bimodal fiber 3, an independent sensor head 14, which is connected in a potential-separated manner exclusively by separate glass fibers (12, 16a, b, c) with a remote sensor electronic system 11.

The sensor electronic system comprises the already known coherent light source 1 for the excitation of the modes in the bimodal fiber 3, a plurality of detectors 17a, b, c for the conversion of the near field and remote field signals into corresponding electrical signals, as well as downstream electronic means 18 to obtain the length change information from these converted near-field and remote-field signals. The resultant useful signal is again available at the signal output 10.

The light source 1 couples its (linearly polarized) light via a polarization-retaining monomode fiber 12 into the entrance end of the bimodal fiber 3. In this case, both fibers are spliced together via a splice 13 so that the $LP_{01}$ fundamental mode and the even $LP_{11}$ mode are excited in approximately equal intensity and the direction of polarization is parallel to one of the two axes of the elliptical fiber core of the bimodal fiber 3. At the exit end of the bimodal fiber 3 the optical means 15 perform the splitting up into a plurality of separate signals $I_{11}$, $I_{21}$ and $I_{22}$, which are fed via separate glass fibers (16a, b, c) to the detectors 17a, b, c.

Before details are given concerning the optical means 15 and the electronic means 18, in the first instance some further explanations are to be given concerning the theoretical background:

The $LP_{01}$ fundamental mode and the $LP_{11}$ mode of the bimodal fiber 3 can be represented to a very good approximation by the Gaussia $TEM_{00}$ and $TEM_{10}$ modes. These two modes have, after leaving the fiber, the form:

$$E_{1m}(x,y,z) = E_{01m}(x,y,z) \exp[-ik(x^2+y^2)/2R(z) - ikz + i(l+m+1)eta] \qquad (4)$$

In this case, $E_{01m}(x,y,z)$ is the amplitude, x and y are the coordinate directions perpendicular and z is the coordinate direction parallel to the beam propagation direction (z=0 corresponds to the position of the fiber end); k is the wave number (k=2pi/lambda, where lambda stands for the optical wavelength). R(z) and eta(z) are given by $$R(z) = z(l+z_0^2/z^2) \qquad (5)$$

$$eta(z) = \tan^{-1}(z/z_0) \qquad (6)$$

where $$z_0 = (pi\Omega_0^2 n)/lambda \qquad (7)$$

n is the refractive index (n≈1 in air), $\Omega_0$ is the lateral spacing from the optical axis at z=0, at which the field amplitude has fallen to 1/e of its value on the axis.

For spacings $z >> z_0$ from the fiber end, eta(z) tends towards pi/2. The two modes $TEM_{00}$ (l=0, m=0) and $TEM_{10}$ (l=1, m=0) (or the $LP_{01}$ and $LP_{11}$ modes) thus experience in their propagation from the optical near field (z≈0) into the optical remote field ($z >> z_0$), a relative phase shift of pi/2. Between the interference patterns of the two modes in the near field and remote field there is thus likewise a phase difference of pi/2. The intensities in the substructures of the interference patterns are then in the near field $$I_{11} = (\tfrac{1}{4})I_0(1 + a\cos\Phi(t)) \qquad (8)$$

$$I_{12} = (\tfrac{1}{4})I_0(1 - a\cos\Phi(t)) \qquad (9)$$

and in the remote field $$I_{21} = (\tfrac{1}{4})I_0(1 + a\sin\Phi(t)) \qquad (10)$$

$$I_{22} = (\tfrac{1}{4})I_0(1 - a\sin\Phi(t)) \qquad (11)$$

where $I_0$ corresponds to the total light intensity.

The object is to obtain the target signal $A\sin\Omega t$ from the near-field and remote-field interference signals. In order to be able to establish the electronic means 18 required for this purpose, the $\cos\Phi$ and $\sin\Phi$ terms in the equations (8)–(11) are expanded on the basis of Bessel functions. In this case, the following are applicable:

$$\cos\Phi(t) = \left[ J_0(A) + 2\sum_{m=1}^{\infty} J_{2m}(A)\cos 2m\Omega t \right]\cos\theta - \left[ 2\sum_{m=1}^{\infty} J_{2m-1}(A)\sin(2m-1)\Omega t \right]\sin\theta \qquad (12)$$

$$\sin\Phi(t) = \left[ 2\sum_{m=1}^{\infty} J_{2m-1}(A)\sin(2m-1)\Omega t \right]\cos\theta - \left[ J_0(A) + 2\sum_{m=1}^{\infty} J_{2m}(A)\cos 2m\Omega t \right]\sin\theta \qquad (13)$$

where the $J_i$ terms are i-th order Bessel functions. Thus, the equations (8)–(11) read as follows:

$$I_{11} = (\tfrac{1}{4})I_0'(1 + aJ_0(A)\cos\Theta - 2aJ_1(A)\sin\Omega t \sin\Theta + h.H.) \quad (14)$$

$$I_{12} = (\tfrac{1}{4})I_0'(1 - aJ_0(A)\cos\Theta + 2aJ_1(A)\sin\Omega t \sin\Theta + h.H.) \quad (15)$$

$$I_{21} = (\tfrac{1}{4})I_0'(1 + aJ_0(A)\sin\Theta + 2aJ_1(A)\sin\Omega t \cos\Theta + h.H.) \quad (16)$$

$$I_{22} = (\tfrac{1}{4})I_0'(1 - aJ_0(A)\sin\Theta - 2aJ_1(A)\sin\Omega t \cos\Theta + h.H.) \quad (17)$$

(in these expressions, h.H. signifies higher harmonics). The signal amplitude is now designated by $(\tfrac{1}{4})I_0'$. Depending upon the optical means 15, $I_0'$ is either $(\tfrac{1}{2})I_0$ (if the optical means 15 have the form shown in FIG. 3A, 3C) or $(\tfrac{1}{3})I_0$ (if the optical means 15 have the form shown in FIG. 3B).

After the conversion of the optical signals (14)–(17) into electrical signals, the slowly varying signal components can be separated from the components which contain $\sin\Omega t$ terms, by means of electronic filters (the electrical signals are designated hereinbelow, just like the corresponding optical signals, by $I_{11}$, $I_{12}$, $I_{21}$ and $I_{22}$).

The slowly varying components are as follows:

$$I_{11}^{DC} = (\tfrac{1}{4})I_0'(1 + aJ_0(A)\cos\Theta) \quad (18)$$

$$I_{12}^{DC} = (\tfrac{1}{4})I_0'(1 - aJ_0(A)\cos\Theta) \quad (19)$$

$$I_{21}^{DC} = (\tfrac{1}{4})I_0'(1 + aJ_0(A)\sin\Theta) \quad (20)$$

$$I_{22}^{DC} = (\tfrac{1}{4})I_0'(1 - aJ_0(A)\sin\Theta) \quad (21)$$

The components which vary with the frequency $\Omega$ are as follows:

$$I_{11}^{AC} = -I_0'aJ_1(A)\sin\Omega t \sin\Theta \quad (22)$$

$$I_{12}^{AC} = I_0'aJ_1(A)\sin\Omega t \sin\Theta \quad (23)$$

$$I_{21}^{AC} = I_0'aJ_1(A)\sin\Omega t \cos\Theta \quad (24)$$

$$I_{22}^{AC} = -I_0'aJ_1(A)\sin\Omega t \cos\Theta \quad (25)$$

Two variants are indicated hereinbelow, for which three input signals are sufficient. A competent selection is made of the trio $I_{11}$, $I_{21}$ and $I_{22}$, which is based on the simplest form of the optical means 15 according to FIG. 3B.

In each instance, two DC and AC terms respectively are now processed so that terms are formed which are proportional to the sum of $|\cos\Omega|$ and $|\sin\Omega|$. To this end, first of all elimination takes place of the offset of $(\tfrac{1}{4})I_0'$ of the DC terms (18) and (20):

$$I_{21}^{DC} + I_{22}^{DC} = I_0' \quad (26)$$

$$I_{11}^{'DC} = I_{11}^{DC} - (\tfrac{1}{4})I_0' = (\tfrac{1}{4})I_0'aJ_0(A)\cos\Omega \quad (27)$$

$$I_{21}^{'DC} = I_{21}^{DC} - (\tfrac{1}{4})I_0' = (\tfrac{1}{4})I_0'aJ_0(A)\sin\Omega \quad (28)$$

In the first variant (with the electronic means 18 according to FIG. 4A), the following quotient is now formed:

$$\frac{|I_{11}^{AC}| + |I_{21}^{AC}|}{|I_{11}^{'DC}| + |I_{21}^{'DC}|} = \quad (29)$$

$$= \frac{aI_0'J_1(A)|\sin\Omega t|(|\sin\theta| + |\cos\theta|)}{(\tfrac{1}{4})aI_0'J_0(A)(|\sin\theta| + |\cos\theta|)}$$

$$= 2\frac{J_1(A)}{J_0(A)}|\sin\Omega t| \approx A|\sin\Omega t| \text{ for } A \ll 1,$$

that is to say, an output signal is obtained which is independent of fluctuations of the light intensity $I_0$ and of the interference contrast a (the notation $|\ldots|$ is necessary in this case, in order to avoid a division by zero for $\Theta = 45°, 135°, \ldots$).

In the second variant (with the electronic means 18 according to FIG. 4B), the following expression is formed:

$$\sqrt{\left[\frac{(I_{11}^{AC})^2 + (I_{21}^{AC})^2}{[(\tfrac{1}{4})(I_{21}^{DC} - I_{22}^{DC})]^2 + [I_{11}^{'DC}]^2}\right]} = \quad (30)$$

$$= \sqrt{\left[\frac{(I_0'aJ_1(A)\sin\Omega t)^2(\sin^2\theta + \cos^2\theta)}{[(\tfrac{1}{4})aI_0'J_0(A)]^2(\sin^2\theta + \cos^2\theta)}\right]}$$

$$= 2\frac{J_1(A)}{J_0(A)}\sin\Omega t \approx A\sin\Omega t \text{ for } A \ll 1,$$

Figure 3A:
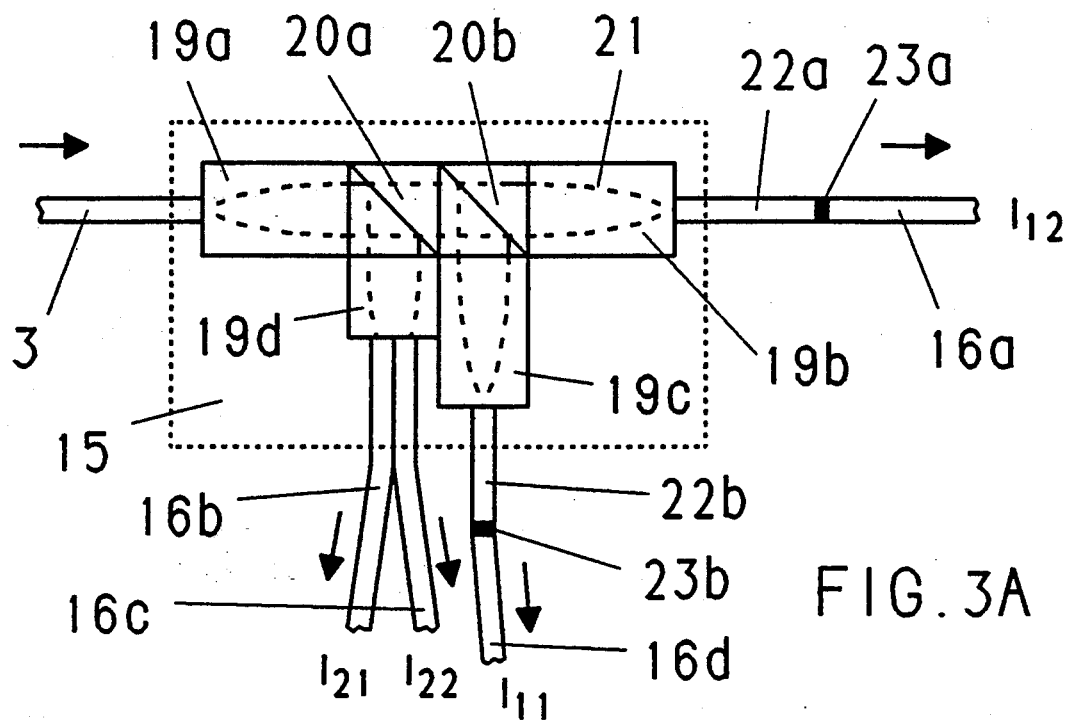
FIGS. 3A–C show various embodiments of the optical means (15) according to FIG. 2.
Figure 3B:
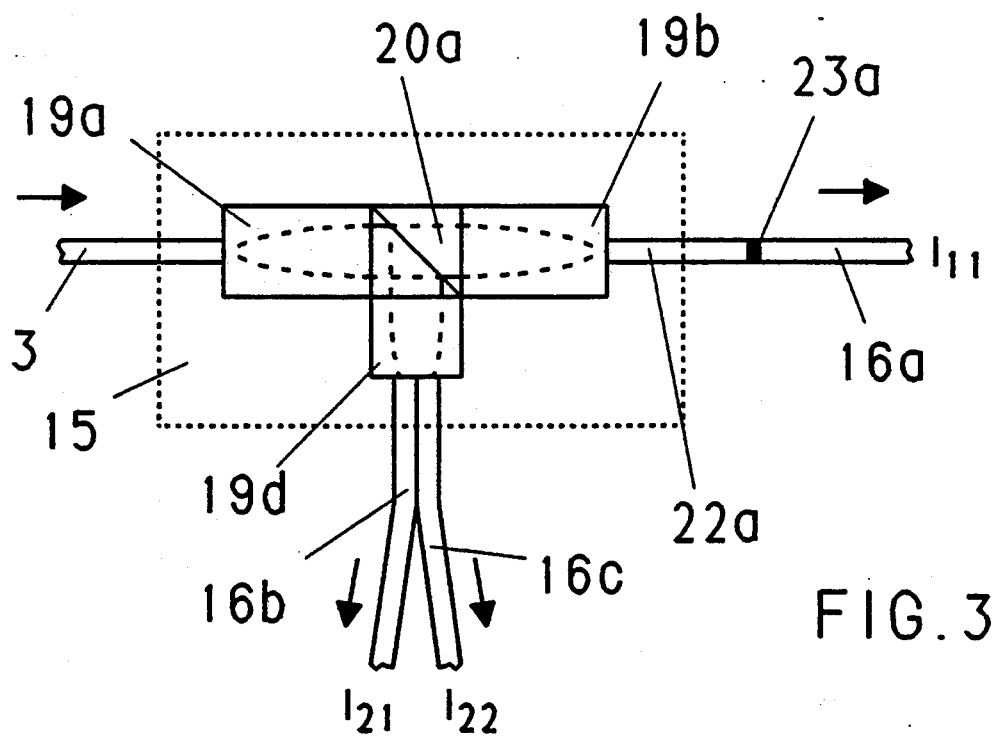
Figure 3C:
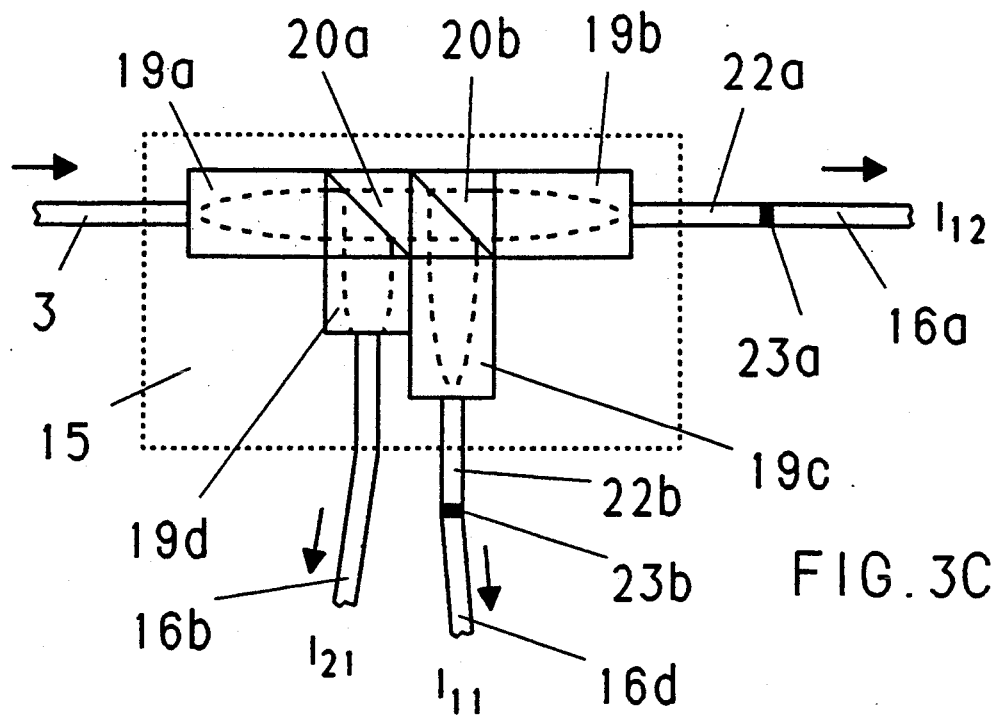

FIGS. 3A–3C show various embodiments of the optical means 15 derived from FIG. 2, which permit the separation from one another of the near-field and remote-field signals according to the equations (8)–(11) and then their guidance via separate glass fibers to the detectors 17a, b, c which are situated at a certain distance.

In the first embodiment of FIG. 3A, all four signals $I_{11}$, $I_{12}$, $I_{21}$ and $I_{22}$ are obtained and are fed by four glass fibers (16a, b, c, d) to the corresponding detectors. The two modes emerging from the bimodal fiber 3 are collimated by a first Selfoc lens 19a (having a pitch of 0.25) to form a parallel beam, the spatial intensity distribution of which corresponds to the remote-field interference pattern (the corresponding beam path 21 is indicated as a broken line in FIGS. 3A–3C).

The collimated beam is split up by means of two cubic beam splitters 20a, b which are disposed one behind the other, into three partial beams. Two of these partial beams are focused by means of two further 0.25 pitch Selfoc lenses 19b and 19c. At the sides of the two Selfoc lenses 19b and 19c remote from the beam splitter 20b, there is then formed the image of the end surface of the bimodal fiber 3 and, consequently, the near-field interference pattern again.

Each one of the two substructures of this near field interference pattern is respectively filtered out by a short piece of a monomode fiber 22a and 22b respectively (which in this case has the effect of a spatial filter). In this case, it has to be ensured that two substructures are filtered out which are out of phase relative to one another by 180°, i.e. which correspond to the signals $I_{11}$ and $I_{12}$. The filtered-out near-field signals can then be transferred by multimode fibers 16a and 16d respectively, which are spliced by means of appropriate splices 23a and 23b respectively onto the monomode fibers 22a and 22b respectively, to the detectors. The use of multimode fibers offers cost advantages (e.g. low-cost fiber plug connections); in principle, in place of the two short monomode fibers 22a, b it is however also possible to use long monomode fibers, which transmit the $I_{11}$ and $I_{12}$ signals over the entire distance to the detectors and thus replace the multimode fibers 16a and 16d.

In the third partial beam there is a further Selfoc lens 19d with a pitch smaller than 0.25 (the focus is thus situated at a certain spacing outside the lens). The Selfoc lens 19d concentrates the beam onto two directly mutually adjacent multimode fibers 16b and 16c. The lens length (or the pitch of the lens) is selected so that (i) the end surface of the lens which is remote from the beam splitter 20a is still situated within the optical remote field and (ii) the beam has however already been concentrated to such an extent that the light is efficiently coupled into the two multimode fibers 16b, c. In this case, the multimode fibers 16b, c are disposed so that they cover in each instance one of the two substructures of the remote-field interference pattern. Preferably, multimode fibers are selected having a relatively large core diameter and small thickness of the fiber sheath (e.g. Hard Cladded Silica (HCS) fibers with a quartz glass core having a thickness of 200 μm and a hard plastic sheath having a thickness of 15 μm; in the case of a sufficiently large core diameter, it is possible even entirely to dispense with the Selfoc lens 19d). Thus, the two multimode fibers pass the signals $I_{21}$ and $I_{22}$ and transmit them to a second detector pair.

As can be seen from the equations (18) to (28), for the evaluation, described hereinbelow, by means of the electronic means 18 three signals of the quartet $I_{11}$, $I_{12}$, $I_{21}$ and $I_{22}$ are sufficient, in the first instance it being fundamentally immaterial which trio is selected.

With the embodiment according to FIG. 3B, to which embodiment the arrangement according to FIG. 2 also relates, the two remote-field signals $I_{21}$ and $I_{22}$ and a near-field signal $I_{11}$ (or $I_{12}$) are obtained. The construction is identical with the one from FIG. 3A, with the exception of the no longer required second beam splitter 20b and of the missing second near field branch. This gives a particularly simple configuration.

Finally, in the embodiment of FIG. 3C, the signals $I_{11}$, $I_{12}$ and one of the two remote-field signals (in the case shown, $I_{21}$) are extracted. In this case, however, it is necessary to bear in mind the greater complexity of the arrangement as compared with the example of FIG. 3B.

The splitter ratio of the beam splitters 20a and 20b is preferably selected so that all signals have the same amplitude. In FIGS. 3A and 3C, the first beam splitter 20A must have the splitter ratio (reflection:transmission) of ($\frac{1}{3}$):($\frac{2}{3}$), and the second beam splitter 20b the ratio ($\frac{1}{2}$):($-1.2$). The signal amplitudes are then $(1/6)I_0$ (disregarding all losses). In FIG. 3B, the splitter ratio of the single beam splitter 20a is ($\frac{1}{2}$):($-1.2$), and the signal amplitudes are ($\frac{1}{4}$)$I_0$ (see above).

Figure 4A:
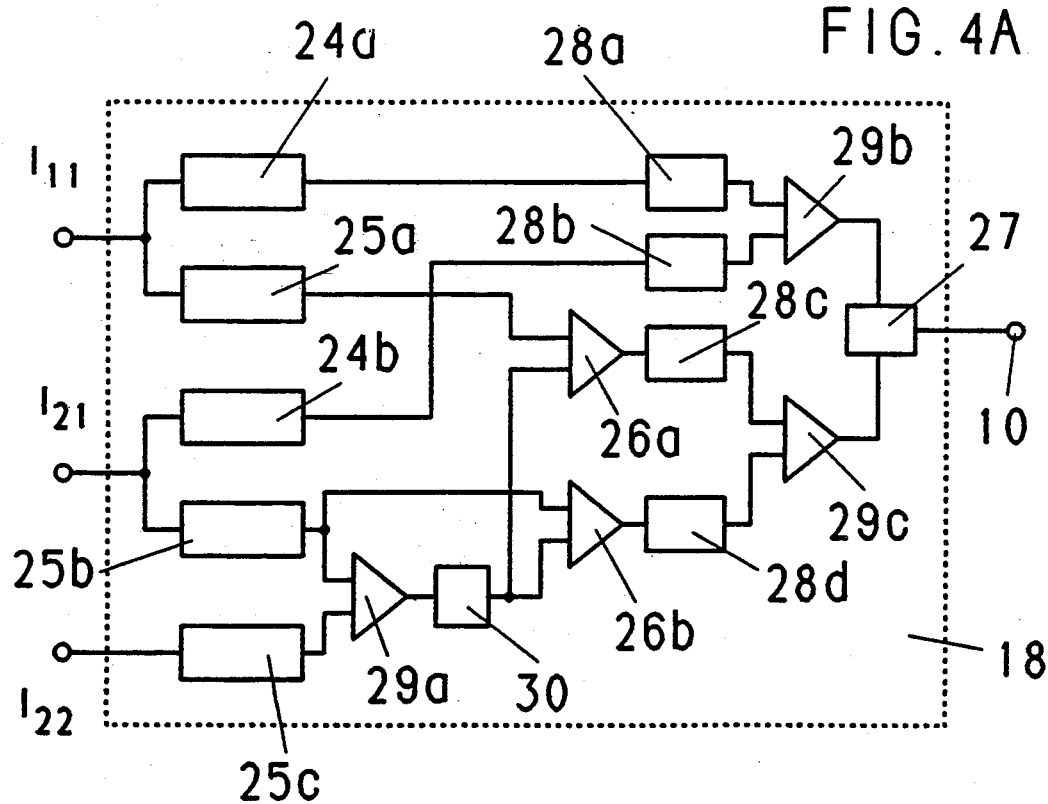
FIGS. 4A–B show two preferred embodiments of the electronic means (18) according to FIG. 2.
Figure 4B:
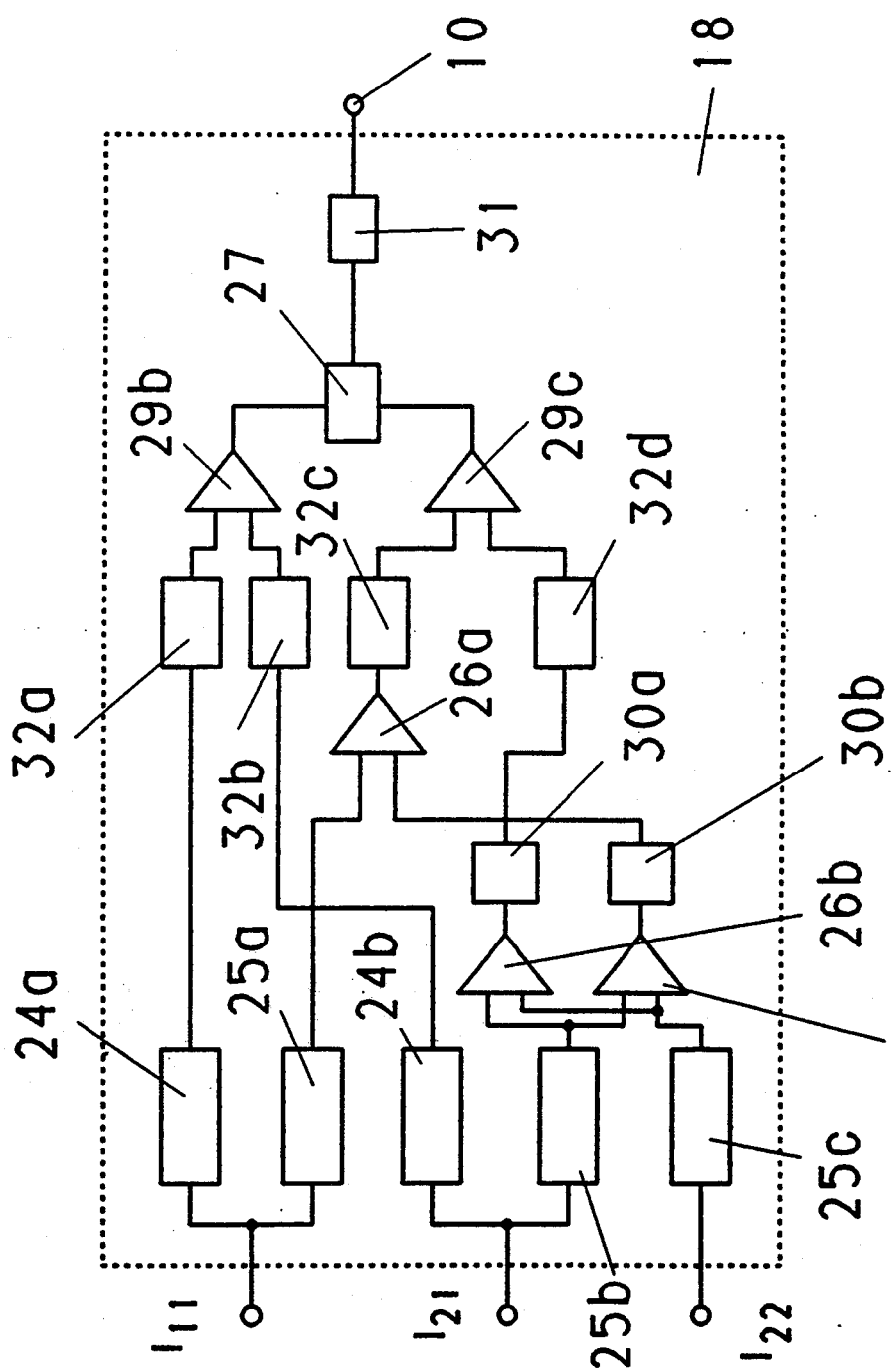

If—as shown in FIG. 2 and FIG. 3B—the optical means 15 are designed so that the signals $I_{11}$, $I_{21}$ and $I_{22}$ are present at their outputs and are converted by means of the detectors 17a, b, c into corresponding electrical signals, for the evaluation according to the equations (18)–(30) it is possible to use for example electronic means 18 of the form as reproduced for the two variants in the block circuit diagrams of FIGS. 4A and 4B.

The circuit according to FIG. 4A comprises two band pass filters 24a, b, three low pass filters 25a, b, c, four absolute value formers 28a, b, c, d and an attenuator 30 (attenuation factor: 0.5) with a respective input and output, as well as two subtractors 26a, b, three adders 29a, b, c and a divider 27 with in each instance two inputs and one output. The low pass filters 25a, b, c have for example a limiting frequency of 10 Hz and thus transmit the slowly varying signals. The band pass filters 24a, b transmit the signal components which vary with the frequency Ω. On the other hand, higher harmonics are blocked. Of a certain disadvantage in this case is the band width which is restricted by the band pass filters 24a, b. For sufficiently small amplitudes of the optical phase shift, the higher harmonics are however small enough to be capable of still being tolerated for many applications. For A=0.1 rad, for example, $J_2(A)=0.025 J_1(A)$; for A=0.05 rad, $J_2(A)=0.012 J_1(A)$. In place of the band pass filters 24a, b, it is possible to use high pass filters, so that the aforementioned restriction of the band width does not occur.

The signals $I_{11}$ and $I_{21}$ pass on the one hand via the first and second band pass filter 24a and 24b respectively and the downstream first and second absolute value former 28a and 28b respectively, to the two inputs of the second adder 29b. This gives the expression in the numerator of the fraction derived from equation (29), which expression is subsequently passed to the first input of the divider 27.

The signals $I_{11}$ and $I_{21}$ pass on the other hand via the first and second low pass filter 25a and 25b respectively in each instance to the first input of the first and second subtractor 26a and 26b respectively. There, in accordance with equations (27) and (28) the differences are formed in each instance with the expression ($\frac{1}{2}$)$I_0'$. This expression, on its part, is generated in accordance with equation (26) from the signals $I_{21}$ and $I_{22}$ by filtering in the second and third low pass filter 25b and 25c respectively, subsequent addition in the first adder 29a and subsequent multiplication by the vector $\frac{1}{2}$ in the attenuator 30.

Finally, the differences (27) and (28) are converted, in the third and fourth absolute value former 28c and 28d respectively, into their absolute values, are added in the third adder 29c and then form at the second input of the divider 27 the denominator of the fraction derived from (29). Correspondingly, the desired useful signal A|sinΩt| appears at the output of the divider 27 or at the signal output 10.

The circuit according to FIG. 4B differs from the one from FIG. 4A not only by a different mode of connection but also by the following changes in the functional units: in place of the one attenuator 30, use is now made of two attenuators (with factor 0.5), the absolute value formers 28a, b, c, d are replaced by squarers 32a, b, c, d, and downstream of the output of the divider 27 there is disposed a root former 31, which extracts the root from the output signal of the divider 27.

The two band pass filters 24a, b, the two first squarers 32a, b and the second adder 29b form—in a similar manner to that shown in FIG. 4A—from the signals $I_{11}$ and $I_{21}$ the numerator of the fraction according to equation (30). The second part of the denominator ($I'_{11}{}^{DC}$) is generated as in the circuit according to FIG. 4A, and is subsequently squared in the third squarer 32c. The first part of the denominator is obtained by forming the difference of the DC components of $I_{21}$ and $I_{22}$ in the second subtractor 26b, subsequent attenuation by the factor $\frac{1}{2}$ in the first attenuator 30a and subsequent squaring in the fourth squarer 32d. The root is extracted from the fraction formed in the divider 27, by means of the root former 31.

Obviously, numerous modifications and variations of the present invention are possible in light of the above teachings. It is therefore to be understood that within the scope of the appended claims the invention may be practised otherwise than as specifically described herein.

What is claimed as new and desired to be secured by Letters Patent of the United States is:

1. A fiber-optic sensor for alternating electric fields or voltages, comprising
   (a) a piezoelectric sensor element (2);
   (b) an optical fiber having an entrance end and an exit end, which optical fiber is fixed at least partially to the sensor element (2) so that a dimensional change of the sensor element (2) in an electric field leads to a change in the length of the fiber; and
   (c) means for measuring the field-dependent change in length of the fiber;
   wherein
   (d) the fiber is a bimodal fiber (3), the parameters of which are selected so that the $LP_{01}$ fundamental mode and the even $LP_{11}$ mode can propagate within it;
   (e) upstream of the entrance end of the bimodal fiber (3) there is disposed a coherent light source (1), which excites the two modes of the bimodal fiber (3); and
   (f) the means for measuring the field-dependent change in length of the fiber comprise optical means (15) for the separation of the near-field and remote-field signals present at the exit end of the bimodal fiber (3), detectors (17a, b, c) for the conversion of the near-field and remote-field signals into corresponding electrical signals and electronic means (18) for obtaining the length change information from these converted near-field and remote-field signals.

2. The fiber-optic sensor as claimed in claim 1, wherein the optical means (15) separate optically from one another, of the two substructures of the near-field interference pattern and the two substructures of the remote-field interference pattern, in total at least three substructures, and pass the latter for evaluation via separate glass fibers to the detectors (17a, b, c).

3. The fiber-optic sensor as claimed in claim 2, wherein the optical means (15) for the separation of the near-field and remote-field signals comprise:
   (a) a first lens, disposed directly at the exit end of the bimodal fiber (3), for the collimation of the two modes emerging from the bimodal fiber (3) to form a parallel beam;
   (b) a first beamsplitter (20A), which is disposed downstream of the first lens and which splits up the parallel beam into two partial beams;
   (c) a second lens with a downstream first coupling-out fiber, which second lens focuses the first of the two partial beams so that the end surface of the bimodal fiber (3) is imaged onto the entrance end of the first coupling-out fiber; and
   (d) a third lens with at least one downstream second coupling-out fiber, which third lens concentrates the second partial beam so that the entrance end of the second coupling-out fiber is still situated within the optical remote field of the bimodal fiber (3), but the light is already efficiently coupled into the second coupling-out fiber.

4. The fiber-optic sensor as claimed in claim 3, wherein
   (a) between the first beam splitter (20a) and the second lens there is disposed a second beam splitter (20b), which second beam splitter (20b) generates a third partial beam; and
   (b) a fourth lens with a downstream third coupling-out fiber is provided, which fourth lens focuses the third partial beam so that the end surface of the bimodal fiber (3) is imaged onto the entrance end of the third coupling-out fiber.

5. The fiber-optic sensor as claimed in claim 3, wherein downstream of the third lens beside the second coupling-out fiber there is disposed a fourth coupling-out fiber, of the same type as the second coupling-out fiber, in such a manner that in each instance one of the two substructures of the remote-field interference pattern of the bimodal fiber (3) is coupled into the two coupling-out fibers.

6. The fiber-optic sensor as claimed in claim 3, wherein the first and third coupling-out fiber are in each instance monomode fibers (22a, b), which act as spatial filters and in each instance filter out one of the two substructures of the near-field interference pattern of the bimodal fiber (3).

7. The fiber-optic sensor as claimed in claim 3, wherein the first and second and, where appropriate, the fourth lens are in each instance a Selfoc lens (19a, b, c) having a pitch of 0.25, and the third lens is a Selfoc lens (19d) having a pitch smaller than 0.25.

8. The fiber-optic sensor as claimed in claim 3, wherein the second and, where appropriate, the fourth coupling-out fiber is in each instance a multimode fiber (16b, c).

9. The fiber-optic sensor as claimed in claim 2, wherein
   (a) the electronic means (18) for obtaining the length change information comprise two band pass filters (24a, b), three low pass filters (25a, b, c), four absolute value formers (28a, b, c, d) and an attenuator 30 with in each instance one input and one output, as well as two subtractors (26a, b), three adders (29a, b, c) and a divider (27) with in each instance two inputs and one output; in which sensor
   (b) the outputs of the two band pass filters (24a, b) are connected in each instance via a first and second absolute value former (28a and 28b respectively) with an input of the second adder (29b), the output of the first low pass filter (25a) is connected with the first input of the first subtractor (26a), the output of the second low pass filter (25b) is connected with the first input of the second subtractor (26b) and the first input of the first adder (29a), and the output of the third low pass filter (25c) is connected with the second input of the first adder (29a);
   (c) the output of the first adder (29a) is connected via the attenuator (30) in each instance with the second input of the first and second subtractor (26a and 26b respectively), the outputs of the two subtractors (26a, b) are connected in each instance via a third and fourth absolute value former respectively (28c and 28d respectively) with an input of the third adder (29c), the outputs of the second and third adder (29b and 29c respectively) are connected in each instance with an input of the divider (27), and the output of the divider is connected with a signal output (10) for the useful signal; and
   (d) the inputs of the band pass filters (24a, b) and low pass filters (25a, b, c) are connected with the detectors (17a, b, c).

10. The fiber-optic sensor as claimed in claim 2, wherein (a) the electronic means (18) for obtaining the length change information comprise two band pass filters (24a, b), three low pass filters (25a, b, c), four squarers (32a, b, c, d), two attenuators (30a, b) and a root former (31) with in each instance one input and one output, as well as two subtractors (26a, b), three adders (29a, b, c) and a divider (27) with in each instance two inputs and one output; in which sensor (b) the outputs of the two band pass filters (24a, b) are connected in each instance via a first and second squarer respectively (32a and 32b respectively) with an input of the second adder (29b), the output of the first low pass filter (25a) is connected with the first input of the first subtractor (26a), the output of the second low pass filter (25b) is connected with the first input of the second subtractor (26b) and the first input of the first adder (29a), and the output of the third low pass filter (25c) is connected with the second input of the second subtractor (26b) and the second input of the first adder (29a);

(c) the output of the first adder (29a) is connected via the second attenuator (30b) with the second input of the first subtractor (26a), the output of the second subtractor (26b) is connected via the first attenuator (30a) and the fourth squarer (32d) with the second input of the third adder (29c), the output of the first subtractor (26a) is connected via the third squarer (32c) with the first input of the third adder (29c), the outputs of the second and third adder (29b and 29c respectively) are connected in each instance with an input of the divider (27), and the output of the divider is connected via the root former (31) with a signal output (10) for the useful signal; and (d) the inputs of the band pass filters (24a, b) and low pass filters (25a, b, c) are connected with the detectors (17a, b, c).

11. The fiber-optic sensor as claimed in claim 1, wherein (a) the bimodal fiber (3) forms, together with the sensor element (2) and the optical means (15) for the separation of the near-field and remote-field signals present at the exit end of the bimodal fiber (3), a separate sensor head (14);

(b) the coherent light source (1), the detectors (17a, b, c) and the electronic means (18) for obtaining the length change information from these near-field and remote-field signals are part of a separate sensor electronic system (11);

(c) the coherent light source (1) is optically connected via a polarization-retaining monomode fiber (12) with the entrance end of the bimodal fiber (3); and (d) the detectors (17a, b, c) are optically connected with the optical means (15) by separate glass fibers in the form of multimode fibers (16a, b, c).

12. The fiber-optic sensor as claimed in claim 11, wherein a part of the multimode fibers (16a, b, c, d) is entirely replaced by monomode fibers.

* * * * *